United States Patent
Hou (10) Patent No.: US 9,748,395 B2
(45) Date of Patent: Aug. 29, 2017

(54) THIN FILM TRANSISTOR AND MANUFACTURING METHOD THEREOF

(71) Applicant: AU OPTRONICS CORPORATION, Hsin-chu (TW)

(72) Inventor: Chih-Yuan Hou, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/244,352

(22) Filed: Aug. 23, 2016

(65) Prior Publication Data

US 2017/0110570 A1   Apr. 20, 2017

(30) Foreign Application Priority Data

Oct. 15, 2015  (TW) .............................. 104133811 A (51) Int. Cl.
| | |
|---|---|
| H01L 29/786 | (2006.01) |
| H01L 29/423 | (2006.01) |
| H01L 29/51 | (2006.01) |
| H01L 23/528 | (2006.01) |
| H01L 29/66 | (2006.01) |
| H01L 29/417 | (2006.01) |

(52) U.S. Cl.
CPC .......... H01L 29/786 (2013.01); H01L 23/528 (2013.01); H01L 29/41733 (2013.01); H01L 29/42384 (2013.01); H01L 29/518 (2013.01); H01L 29/66742 (2013.01)

(58) Field of Classification Search
CPC ............. H01L 29/786; H01L 29/41733; H01L 29/42384; H01L 29/518; H01L 29/66742; H01L 23/528
See application file for complete search history.

(56) References Cited

U.S. PATENT DOCUMENTS

| | | | |
|---|---|---|---|
| 2002/0045299 A1 | 4/2002 | Young | |
| 2006/0258034 A1* | 11/2006 | Sohn | .................. H01L 29/41733 438/30 |
| 2014/0362059 A1* | 12/2014 | Uemura | .............. H01L 29/7869 345/204 |
| 2016/0260747 A1* | 9/2016 | Cai | ........................ H01L 29/786 |

FOREIGN PATENT DOCUMENTS

WO      2014146291 A1     9/2014

\* cited by examiner

*Primary Examiner* — Christine Enad
(74) *Attorney, Agent, or Firm* — Tim Tingkang Xia, Esq.; Locke Lord LLP (57) ABSTRACT

A thin film transistor includes a substrate, a gate electrode disposed on the substrate, a channel layer located on the gate electrode, a gate insulation layer disposed between the gate electrode and the channel layer, an etching stop layer disposed on the channel layer, and a source electrode and a drain electrode disposed on the etching stop layer. The gate electrode has multiple through holes, the etching stop layer has multiple contact holes overlapped with the through holes in a direction perpendicular to the substrate, and the source and drain electrodes are respectively electrically connected to the channel layer through the contact holes. A method of manufacturing the thin film transistor, where the contact holes in the etching stop layer are formed by backside exposure using the gate electrode as a mask. A conductivity of a region of the channel layer exposed by the contact holes has a great conductivity.

11 Claims, 7 Drawing Sheets

THIN FILM TRANSISTOR AND MANUFACTURING METHOD THEREOF

CROSS-REFERENCE TO RELATED APPLICATIONS

This non-provisional application claims priority under 35 U.S.C. §119(a) on Patent Application No. 104133811 filed in Taiwan, R.O.C. on Oct. 15, 2015, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to a thin film transistor and a manufacturing method thereof, and in particular, to a thin film transistor having a gate electrode provided with through holes and a manufacturing method thereof.

BACKGROUND OF THE INVENTION

Flat display panels having excellent features such as radiation free and high definition have dominated the market. Common flat displays include liquid crystal displays, plasma displays, organic electroluminescent displays, and the like. By using the most common liquid crystal displays as an example, the liquid crystal display is mainly formed by a pixel array substrate, a color filter substrate, and a liquid crystal layer sandwiched between the two. On the conventional pixel array substrate, thin film transistors are mostly used as switching elements of pixel structures, and therefore, the performance of the liquid crystal display depends on the quality of the thin film transistors. In other words, the conductivity of a channel layer in the thin film transistor greatly affects the quality of the thin film transistor and the performance of the liquid crystal display.

On the other hand, in the process of manufacturing the thin film transistor, four masks are needed to respectively pattern a gate electrode, an oxide semiconductor, an etching stop layer and a source electrode/drain electrode. However, the masks are expensive, and using a large number of masks to manufacture the thin film transistors will increase the overall manufacturing cost. Therefore, how to reduce the number of the masks as well as improve the quality of the thin film transistor becomes a task for the liquid crystal display industry that is in urgent need to be solved.

SUMMARY OF THE INVENTION

In one aspect, the present invention relates to a thin film transistor, where a gate electrode thereof has through holes, so as to effectively reduce the number of masks required in the process and improve the conductivity of a channel layer.

In one embodiment, a thin film transistor includes a substrate, a gate electrode, a channel layer located on the gate electrode, a gate insulation layer disposed between the gate electrode and the channel layer, an etching stop layer disposed on the channel layer, and a source electrode and a drain electrode disposed on the etching stop layer. The gate electrode has multiple through holes, the etching stop layer has multiple contact holes to expose a part of the channel layer, and the source electrode and the drain electrode are respectively electrically connected to the channel layer through the contact holes.

In certain embodiments, the through holes overlap the contact holes.

In certain embodiments, edges of the through holes are substantially aligned to edges of the contact hole.

In certain embodiments, a conductivity of a region of the channel layer exposed by the contact holes is greater than a conductivity of a region of the channel layer shielded by the etching stop layer.

In certain embodiments, a diameter of each through hole is about 1-2 μm greater than a diameter of each contact hole. In one embodiment, the diameter of each contact hole is between 3 μm and 5 μm.

In certain embodiments, the gate insulation layer comprises SiOx, SiNx, or a stacked structure thereof. The channel layer is made of a material selected from at least one of an amorphous silicon material, a polysilicon material, and a metal oxide semiconductor material. The etching stop layer is made of a material selected from at least one of silicon oxide (SiOx) and aluminum oxide (AlOx).

In another aspect, the present invention relates to a method of manufacturing a thin film transistor. In certain embodiments, the method includes the steps of: providing a substrate; forming a gate electrode on the substrate, where the gate electrode has a plurality of through holes; forming a gate insulation layer on the gate electrode; forming a channel layer on the gate insulation layer; forming an etching stop layer on the channel layer; patterning the etching stop layer, so as to forming a plurality of contact holes in the etching stop layer to expose part of the channel layers; and forming a source electrode and a drain electrode on the etching stop layer, where the source electrode and the drain electrode are respectively electrically connected to the channel layer through the contact holes.

In certain embodiments, the step of patterning the etching stop layer includes: forming a photoresist layer on the etching stop layer; patterning the photoresist layer by using the gate electrode as an exposure mask, so as to expose a part of the etching stop layer; and removing the part of the etching stop layer exposed by the photoresist layer, so as to form the contact holes.

In certain embodiments, the step of patterning the photoresist layer includes: irradiating an ultraviolet light from a bottom side of the substrate, such that a conductivity of a region of the channel layer exposed by the contact holes is greater than a conductivity of a region of the channel layer shielded by the etching stop layer.

In certain embodiments, the contact holes overlapped with the through holes in a direction perpendicular to the substrate.

Based on the above, the gate electrode in the thin film transistor has the through holes, so that the process of forming the contact holes in the etching stop layer can be implemented by using backside exposure. Therefore, compared with the conventional thin film transistor, a mask can be saved, thereby reducing the manufacturing cost and reducing alignment error. On the other hand, as part of the channel layer is irradiated by light in the process of backside exposure, the conductivity of the regions can be improved, thereby improving the quality of the thin film transistor and the liquid crystal display.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to a thin film transistor and a method for manufacturing the thin film transistor.

FIGS. 1A, 2A, 3A, 4A, 5A and 6A are top views of schematic flow charts of a manufacturing method of a thin film transistor according to one embodiment of the present invention. FIGS. 1B, 2B, 3B, 4B, 5B and 6B are cross sectional views of the schematic flow charts along a line A-A' of FIGS. 1A, 2A, 3A, 4A, 5A and 6A, respectively.

Figure 1A:
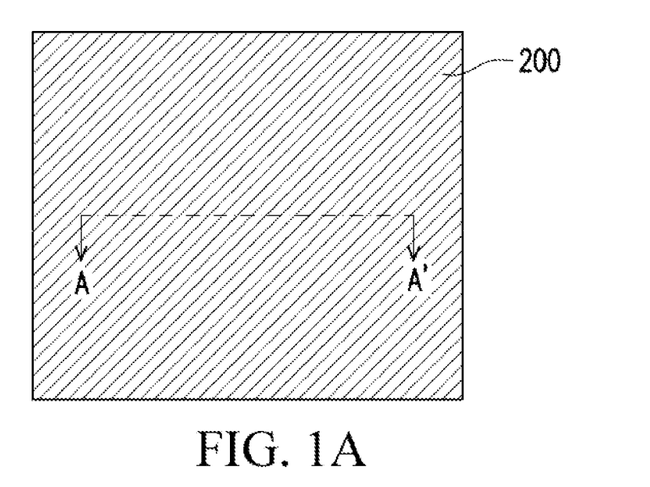
FIGS. 1A, 2A, 3A, 4A, 5A and 6A are top views of schematic flow charts of a manufacturing method of a thin film transistor according to one embodiment of the present invention.
Figure 1B:
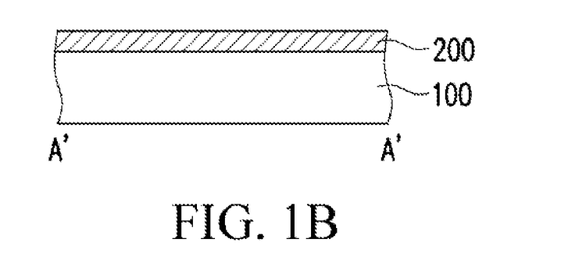
FIGS. 1B, 2B, 3B, 4B, 5B and 6B are cross-sectional views of the schematic flow charts along a line A-A' of FIGS. 1A, 2A, 3A, 4A, 5A and 6A, respectively.

Referring to FIGS. 1A and 1B, a substrate 100 is provided, and a first conductive material layer 200 is formed on the substrate 100. In certain embodiments, the material of the substrate 100 may be glass, quartz, organic polymer, or other applicable materials. In certain embodiments, since backside exposure is performed in the subsequent process, the material of the substrate 100 is a material having high light transmittance. In certain embodiments, considering the conductivity, a metal material is generally used as the first conductive material layer 200, but the present invention is not limited thereto. The first conductive material layer 200 may also be another type of conductive material, for example, alloy, a nitride of a metal material, an oxide of a metal material, an oxynitride of a metal material, or a stacked layer of metal materials and other conductive materials.

Figure 2A:
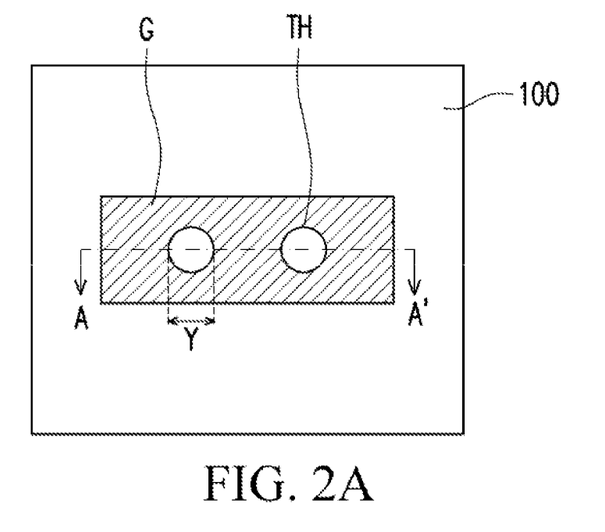
Figure 2B:
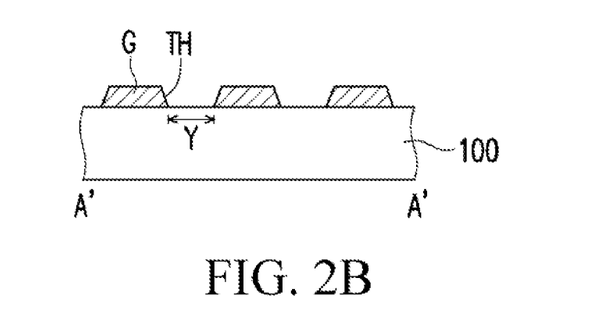

Then, a patterning process is performed on the first conductive material layer 200, so as to form a gate electrode G on the substrate 100, as shown in FIGS. 2A and 2B. The gate electrode G has a plurality of through holes TH, and each of the through holes TH respectively have the diameter Y. In this embodiment, two through holes TH are used as an example, but the present invention is not limited thereto. In other embodiments, as required in the subsequent process, the gate electrode G may also have more than two through holes TH. In certain embodiments, the diameter Y of each of the through holes TH is between 3 μm and 7 μm.

Figure 3A:
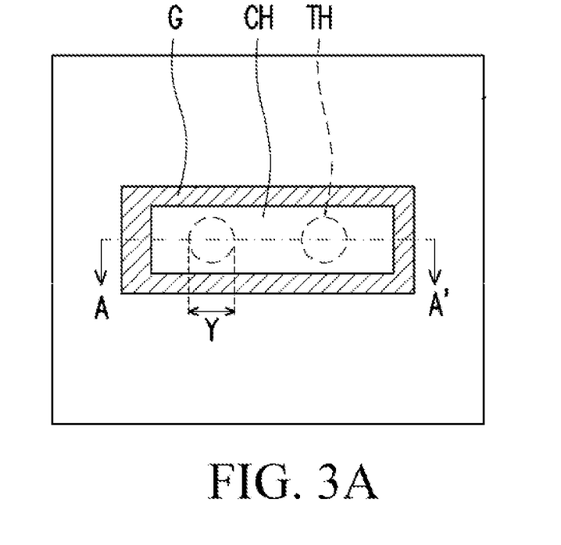
Figure 3B:
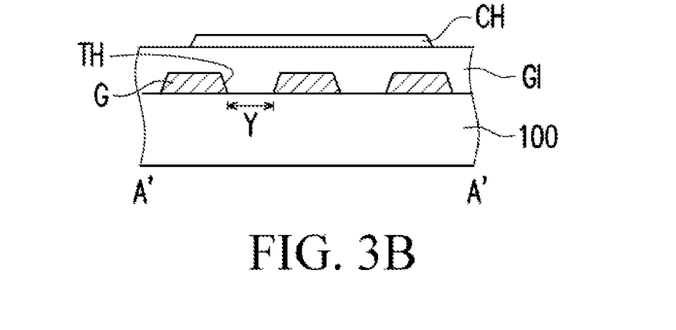

Referring to FIGS. 3A and 3B, after the gate electrode G is formed, a gate insulation layer GI and a channel layer CH are formed sequentially on top of the gate electrode G. The material of the gate insulation layer GI is, for example, an inorganic dielectric material. In certain embodiments, the material of the gate insulation layer GI may include, for example, silicon oxide (SiOx), silicon nitride (SiNx), or a stacked structure thereof In certain embodiments, the material of the channel layer CH may be selected from at least one of an amorphous silicon material, a polysilicon material, or a metal oxide semiconductor material, including amorphous silicon (a-Si), indium-gallium-zinc oxide (IGZO), zinc oxide (ZnO), tin oxide (SnO), indium-zinc oxide (IZO), gallium-zinc oxide (GZO), zinc-tin oxide (ZTO) or indium-tin oxide (ITO), but the present invention is not limited thereto. In certain embodiments, the two through holes TH in the channel layer CH and in the gate electrode G overlap with each other.

Figure 4A:
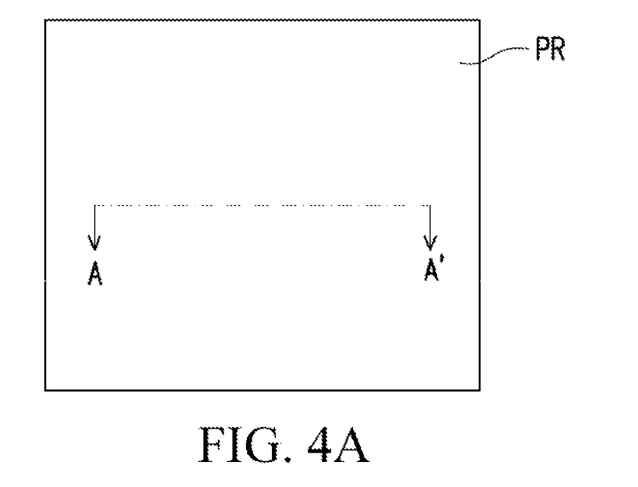
Figure 4B:
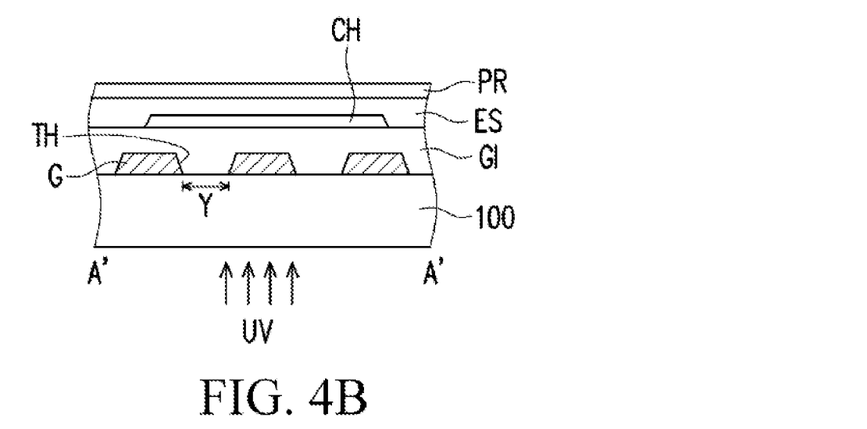

As shown in FIGS. 4A and 4B, an etching stop layer ES and a photoresist layer PR are formed on the gate insulation layer GI and the channel layer CH. In certain embodiments, the material of the etching stop layer ES is, for example, SiOx or aluminum oxide (AlOx). However, the present invention is not limited thereto. In other embodiments, other suitable materials may also be used as the etching stop layer ES. The etching stop layer ES is function as blocking an etchant used in the subsequent process, so as to prevent the etchant from damaging other elements such as the channel layer CH. In certain embodiment, the material of the photoresist layer PR is, for example, photosensitive resin or other photosensitive materials.

Figure 5A:
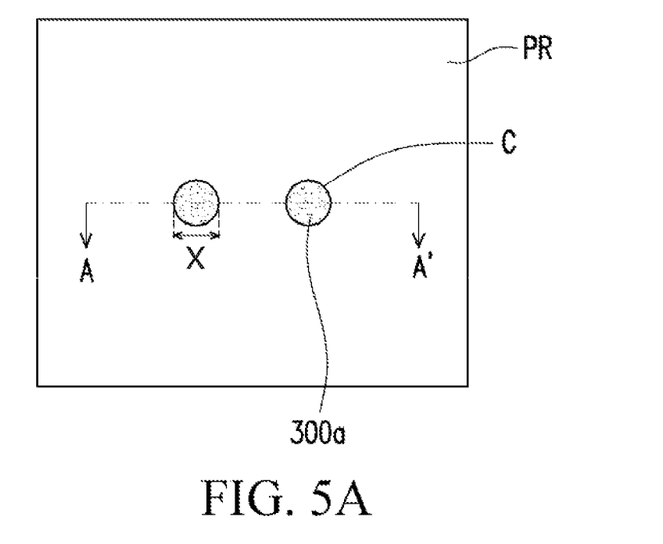
Figure 5B:
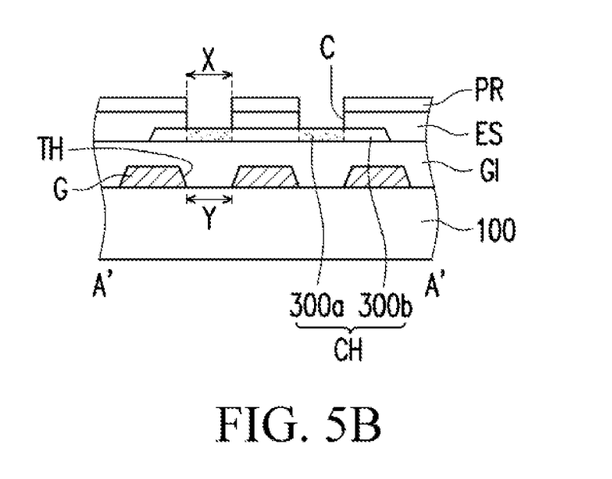

Then, ultraviolet (UV) light is used to conduct backside exposure and etching processes on the semi-finished product of the thin film transistor, so as to pattern the etching stop layer ES, thereby obtaining the structure shown in FIGS. 5A and 5B. In certain embodiments, in the process, the gate electrode G having the through holes TH is used as the mask, and the photoresist layer PR is patterned by the UV light so that the photoresist layer PR exposes part of the etching stop layer ES. Then, the part of the etching stop layer ES exposed by the photoresist layer PR is removed, so as to pattern the etching stop layer ES, such that the etching stop layer ES has contact holes C that expose part of the channel layer CH. The gate electrode G is used as the mask, and therefore, in certain embodiments, the contact holes C of the etching stop layer ES will completely overlap the through holes TH of the gate electrode G. In other words, edges of the contact holes C of the etching stop layer ES substantially align with edges of the through holes TH of the gate electrode G. In this case, the diameter X of the contact hole C equals the diameter Y of the through hole TH. In certain embodiments, based on using of different etching methods matched with corresponding photoresist, the edges of the contact holes C of the etching stop layer ES may also not be aligned with edges of the through holes TH of the gate electrode G. In one embodiment, the contact hole C may be smaller than the through hole TH. For example, the diameter X of the contact hole C is between 3 μm and 5 μm, and the diameter Y of each through hole TH is between X and X+2 μm. In certain embodiments, the UV light is used as an example of the irradiation light, but the present invention is not limited thereto. In other embodiments, other types of light may be used with specific photoresist to reach the same patterning effect.

In view of the above, the patterning of the etching stop layer ES is implemented by using backside exposure, and therefore, the UV light will irradiate the part of the channel layer CH corresponding to the through hole TH of the gate electrode G, thereby forming a first channel region 300a. On the other hand, the region of the channel layer CH that is shielded by the gate electrode G and is not irradiated by the UV light forms a second channel region 300b. The first channel region 300a is irradiated by the UV light, so that it has greater conductivity than the second channel region 300b. In other words, the conductivity of the first channel region 300a exposed by the contact hole C is greater than the conductivity of the second channel region 300b shielded by the etching stop layer ES.

Figure 6A:
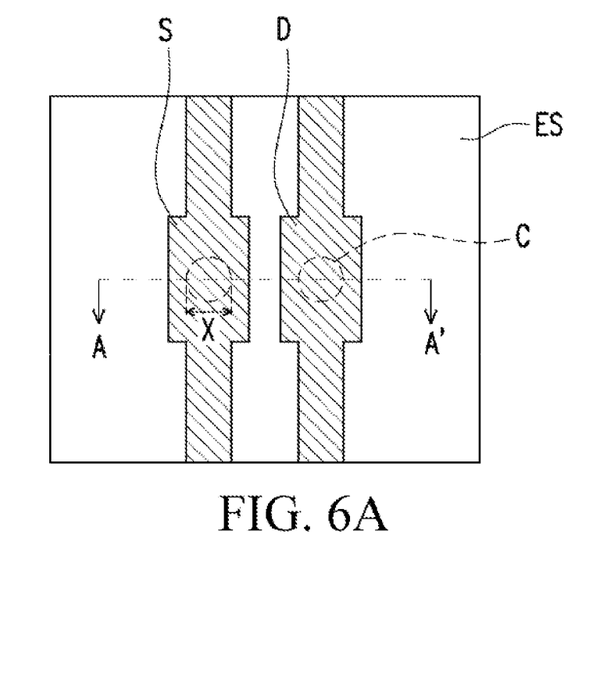
Figure 6B:
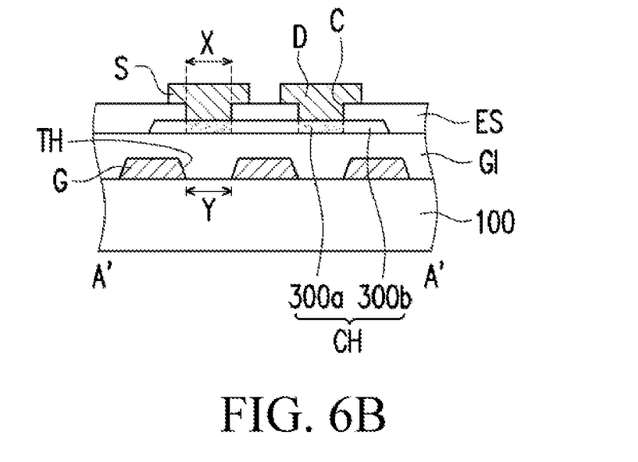

Referring to FIGS. 6A and 6B together, after finishing the patterning of the etching stop layer ES, the photoresist layer PR is first removed, and a source electrode S and a drain electrode D are then formed on the etching stop layer ES. In certain embodiments, a second conductive material layer (not shown) is formed on the etching stop layer ES, and the second conductive material layer is patterned by using photolithography to form the source electrode S and the drain electrode D. The material of the second conductive material layer may be the same as or different from the material of the first conductive material layer 200. In other words, the source electrode S and the drain electrode D may be formed by at least one material selected from a metal material, alloy, a nitride of a metal material, an oxide of a metal material, an oxynitride of a metal material, or a stacked layer of a metal material and other conductive materials. The source electrode S and the drain electrode D are respectively electrically connected to the channel layer CH through the contact holes C. In certain embodiments, the first channel region 300a is electrically connected to the source electrode S and the drain electrode D respectively through the contact holes C and the second channel region 300b is shielded by the etching stop layer ES. The region exposed by the contact hole C is the first channel region 300a, and therefore, the source electrode S and the drain electrode D are substantially electrically connected to the corresponding first channel region 300a having greater conductivity. Therefore, the thin film transistor according to certain embodiments of the present invention has better conductivity.

Figure 7:
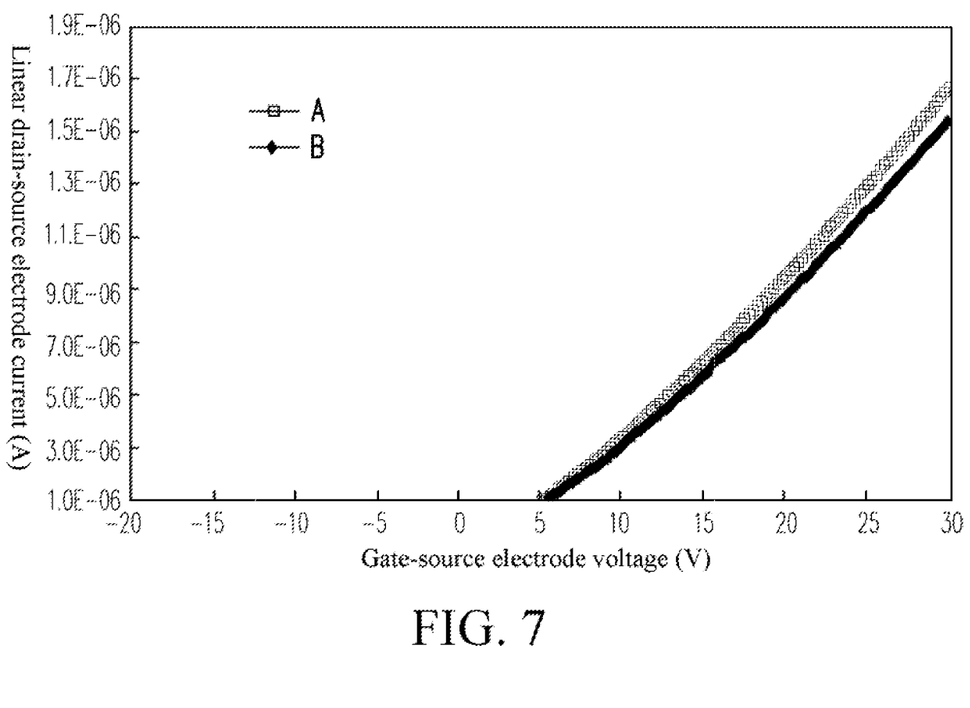
FIG. 7 is a linear IDS-VGS curve graph of a conventional thin film transistor and a thin film transistor according to one embodiment of the present invention.

FIG. 7 is a linear IDS-VGS curve graph of a conventional thin film transistor and a thin film transistor of an embodiment of the present invention. Referring to FIG. 7, the curve A represents a curve of the thin film transistor in an embodiment of the present invention, and the curve B represents a curve of the conventional thin film transistor. Specifically, a gate electrode of the thin film transistor of the curve A includes through holes, a gate electrode of the thin film transistor of the curve B does not include any through hole, and therefore, a channel layer in the thin film transistor of the curve B will not be irradiated by a backlight source. As shown in FIG. 7, under the same gate-source electrode voltage, the curve A has higher linear drain-source electrode amperage, and this is more obvious when the voltage is higher. In other words, the thin film transistor represented by the curve A has better conductivity than the thin film transistor represented by the curve B. The curves shown in FIG. 7 prove that, the source electrode S and the drain electrode D are substantially electrically connected to the first channel region 300a having greater conductivity, so that the thin film transistor according to certain embodiments of the present invention has better conductivity as compared with the conventional thin film transistor.

In view of the above, the gate electrode in the thin film transistor according to certain embodiments of the present invention has the through holes, so that the process of forming the contact holes in the etching stop layer may be implemented by using backside exposure. Therefore, compared with the conventional thin film transistor, a mask may be omitted, thereby reducing the manufacturing cost and reducing the alignment error. Further, part of the channel layer is irradiated by the light in the process of backside exposure, so that the conducting performance of the regions may be improved, thereby improving the qualities of the thin film transistor and the liquid crystal display.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A thin film transistor, comprising:
   a substrate;
   a gate electrode, disposed on the substrate, and having a plurality of through holes;
   a channel layer, located on the gate electrode;
   a gate insulation layer, disposed between the gate electrode and the channel layer;
   an etching stop layer, disposed on the channel layer, and having a plurality of contact holes overlapped with the through holes in a direction perpendicular to the substrate; and
   a source electrode and a drain electrode, disposed on the etching stop layer and respectively electrically connected to the channel layer through the contact holes,
   wherein the channel layer further comprises a first channel region and a second channel region, the first channel region is electrically connected to the source electrode and the drain electrode respectively through the contact holes, and the second channel region is shielded by the etching stop layer.

2. The thin film transistor according to claim 1, wherein edges of the through holes are substantially aligned to edges of the contact holes.

3. The thin film transistor according to claim 1, wherein a conductivity of the first channel region is greater than a conductivity of the second channel region.

4. The thin film transistor according to claim 1, wherein a diameter of each through hole is about 1-2 μm greater than a diameter of each contact hole.

5. The thin film transistor according to claim 4, wherein the diameter of each contact hole is between 3 μm and 5 μm.

6. The thin film transistor according to claim 1, wherein the gate insulation layer comprises SiOx, SiNx, or a stacked structure thereof.

7. The thin film transistor according to claim 1, wherein the channel layer is made of a material selected from at least one of an amorphous silicon material, a polysilicon material, and a metal oxide semiconductor material.

8. The thin film transistor according to claim 1, wherein the etching stop layer is made of a material selected from at least one of silicon oxide (SiOx) and aluminum oxide (AlOx).

9. A manufacturing method of a thin film transistor, comprising:
   providing a substrate;
   forming a gate electrode on the substrate, wherein the gate electrode has a plurality of through holes;
   forming a gate insulation layer on the gate electrode;
   forming a channel layer on the gate insulation layer;
   forming an etching stop layer on the channel layer;
   patterning the etching stop layer, so as to form a plurality of contact holes in the etching stop layer to expose part of the channel layer; and
   forming a source electrode and a drain electrode on the etching stop layer, wherein the source electrode and the drain electrode are respectively electrically connected to the channel layer through the contact holes,
   wherein the step of patterning the etching stop layer comprises:
      forming a photoresist layer on the etching stop layer;
      patterning the photoresist layer by using the gate electrode as an exposure mask, so as to expose a part of the etching stop layer; and
      removing the part of the etching stop layer exposed by the photoresist layer, so as to form the contact holes.

10. The manufacturing method of a thin film transistor according to claim 9, wherein the step of patterning the photoresist layer comprises:
    irradiating an ultraviolet light from a bottom side of the substrate, such that a conductivity of a region of the channel layer exposed by the contact holes is greater than a conductivity of a region of the channel layer shielded by the etching stop layer.

11. The manufacturing method of a thin film transistor according to claim 9, wherein the contact holes are overlapped with the through holes in a direction perpendicular to the substrate.

* * * * *